(12) United States Patent
Janke

(10) Patent No.: US 8,067,934 B2
(45) Date of Patent: Nov. 29, 2011

(54) MEASUREMENT DEVICE FOR MEASURING A MAGNETIC FIELD

(75) Inventor: Ralf Janke, Denzlingen (DE)

(73) Assignee: Micronas GmbH, Freiburg (DE)

( * ) Notice: Subject to any disclaimer, the term of this patent is extended or adjusted under 35 U.S.C. 154(b) by 579 days.

(21) Appl. No.: 12/209,625

(22) Filed: Sep. 12, 2008

(65) Prior Publication Data

US 2009/0140726 A1  Jun. 4, 2009

(30) Foreign Application Priority Data

Sep. 13, 2007  (EP) .................................... 07017942

(51) Int. Cl.
*G01B 7/14* (2006.01)
*G01R 33/12* (2006.01)

(52) U.S. Cl. ..................... 324/207.15; 324/228; 324/244

(58) Field of Classification Search ............. 324/207.15, 324/228, 244
See application file for complete search history.

(56) References Cited

U.S. PATENT DOCUMENTS

| | | | |
|---|---|---|---|
| 6,366,076 B1 | 4/2002 | Karrer et al. | |
| 6,566,855 B1 | 5/2003 | Nguyen et al. | |
| 6,624,624 B1 | 9/2003 | Karrer et al. | |
| 7,164,263 B2 | 1/2007 | Yakymyshyn et al. | |
| 2008/0204010 A1 | 8/2008 | Crozier et al. | |

FOREIGN PATENT DOCUMENTS

| | | |
|---|---|---|
| DE | 69802203 T2 | 6/2002 |
| DE | 1314602 A1 | 10/2004 |
| EP | 1012609 B1 | 10/2001 |
| EP | 1183543 B1 | 4/2003 |
| EP | 10314993 A2 | 5/2003 |
| EP | 1746430 A1 | 1/2007 |
| TW | 434598 B | 5/2001 |
| TW | 448528 B | 8/2001 |
| WO | 9848287 A1 | 10/1998 |
| WO | 2006034551 A1 | 4/2006 |

OTHER PUBLICATIONS

Dalessandro, L., N. Karrer, and J. W. Kolar. "A Novel Isolated Current Sensor for High-Performance Power Electronics Applications." APEC 2006. Twenty-First Annual IEEE Applied Power Electronics Conference and Exposition. Mar. 19, 2006-Mar. 23, 2006. pp. 559-566.

Karrer, N. "Measurements[1] with HAL805." Mar. 15, 2000. pp. 1-8. Version 1.00.

(Continued)

*Primary Examiner* — Reena Aurora
(74) *Attorney, Agent, or Firm* — Muncy, Geissler, Olds & Lowe, PLLC

(57) ABSTRACT

A measuring device to measure a magnetic field having at least one measuring coil and at least one sensor to measure low-frequency magnetic fields, which measuring coil and which sensor have their planes of extension each positioned or positionable transverse to the flux direction of the magnetic field. The measuring coil and the sensor are connected to a signal processing device with which, depending on a first measurement signal provided by the measuring coil and a second measurement signal provided by the sensor, an output signal that essentially corresponds to the magnetic field can be generated. The measuring coil, the sensor, and the signal processing device are monolithically integrated into a semiconductor chip. The measuring coil may also be formed by means of traces of a printed circuit board on which the semiconductor chip that has the sensor and the signal processing device is located.

14 Claims, 8 Drawing Sheets

Fig. 1

OTHER PUBLICATIONS

Figure 1:
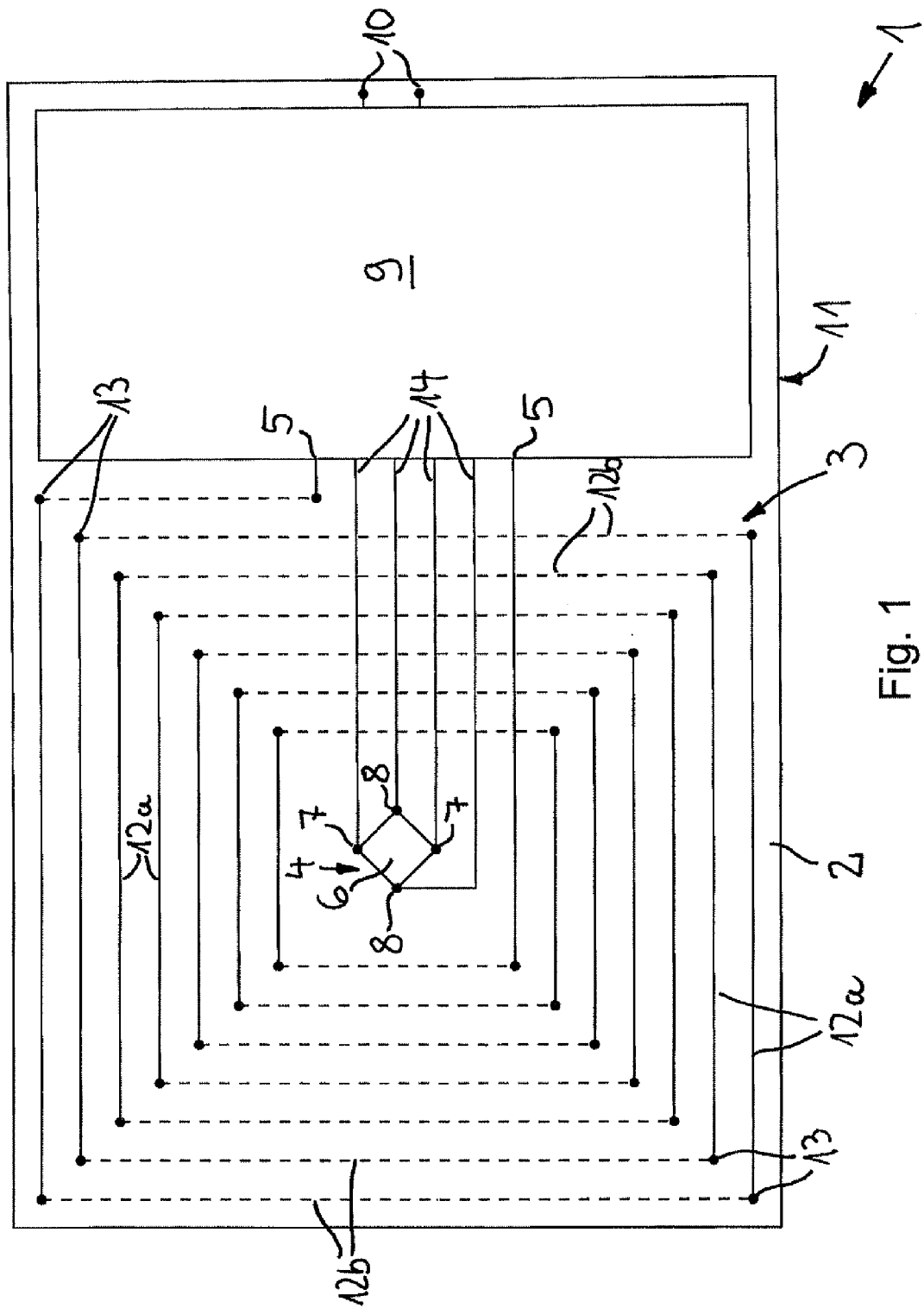

Karrer, Nicolas and Hofer-Noser, Patrick. "A New Current Measuring Principle for Power Electronic Applications." Proceedings of ISPSD '99, pp. 279-282, May 1999. Electrical Engineering and Design Lab (EEK). Zurich, Switzerland.

Karrer, Nicolas, Hofer-Noser, Patrick, and Henrad, Daniel "A New Current Probe with a Wide Bandwidth." Electrical Engineering and Design Lab (EEK). Swiss Federal Institute of Technology. Zurich, Switzerland.

Xiao, Chucheng, Zhao, Lingyin, Asada, Tadashi, Odendaal, W. G., and Van Wyk, J. D. "An Overview of Integratable Current Sensor Technologies." Conference Record of the 2003 IEEE Industry Applications Conference. 38th IAS Annual Meeting. Salt Lake City, UT, Oct. 12-16, 2003. vol. 3 of 3. Conference 38, Oct. 12, 2003. pp. 1251-1258.

MEASUREMENT DEVICE FOR MEASURING A MAGNETIC FIELD

The invention relates to a measuring device to measure a magnetic field having at least one measuring coil and at least one sensor to measure low-frequency magnetic fields, which measuring coil and which sensor have their planes of extension each positioned or positionable in said magnetic field transverse to the flux direction of the magnetic field, and the measuring coil and the sensor are connected to a signal processing device with which, depending on a first measurement signal provided by the measuring coil and a second measurement signal provided by the Hall-effect sensor, an output signal that essentially corresponds to the magnetic field can be generated. A sensor for measuring low-frequency magnetic fields is understood to mean a sensor that at low frequencies and/or in a constant magnetic field has a greater measurement accuracy and/or measurement sensitivity than the measuring coil. The sensor for measuring the low-frequency magnetic fields may in particular be a Hall-effect sensor and/or a magnetoresistive sensor.

A measuring device of this type, which is used for measuring a magnetic field produced by an electrical current flowing in a conductor is known from DE 698 02 203 T2. The measuring device has a circuit board with an opening through which an electrical conductor passes normal to the plane of the circuit board. A Rogowski coil that surrounds the current-carrying conductor is placed on the printed circuit board as a printed circuit. A plurality of Hall-effect sensors, which are located at regular distances around the conductor, are mounted on the printed circuit board between the Rogowski coil and the conductor. In particular, high-frequency signal components that are contained in the magnetic field can be measured with high precision with the aid of the Rogowski coil. Low-frequency signal components and the constant component of the magnetic field can be measured with the Hall-effect sensors. Laterally next to the Rogowski coil there are located electric components for a signal processing device that is connected to the Rogowski coil and the Hall-effect sensors by means of conductor traces. With the aid of the signal processing device, an output signal that models the current that is flowing in the conductor is formed from the measurement signals of the Rogowski coil and the Hall-effect sensors. This measuring device does allow the electrical current or the magnetic field induced by the electrical current to be measured across a broad range of values, however it is relatively complex and expensive. Furthermore, the measuring device has relatively large dimensions.

Therefore, the object of the invention is to provide a measuring device of the type referred to above that permits an economical and compact design.

This object is accomplished by integrating the measuring coil, the sensor, and the signal processing device monolithically into a semiconductor chip. The measuring coil can then be produced with precisely specified, reproducible dimensions using semiconductor fabrication methods. The measuring coil can also be positioned very accurately relative to the sensor during the fabrication of the measuring device. In this way, the measuring device makes high measurement accuracy possible.

It is advantageous if the windings of the measuring coil essentially follow the outer contour of the semiconductor chip and/or a line that is approximately parallel to this contour at a distance from it. In this way, nearly the entire magnetic flux that travels through the chip surface of the semiconductor chip can be utilized to induce an electrical voltage in the measuring coil. In this way the measuring device permits high measurement sensitivity.

The object referred to above can also be achieved with a measurement device of the type referred to above in which the semiconductor chip is located on an essentially two-dimensional substrate and the measuring coil is formed by at least one conductor trace that is located on and/or in the substrate if the sensor and the signal processing device are monolithically integrated into a semiconductor chip located on the substrate. In this case the substrate may be a rigid, electrically insulating plate or a flexible, electrically insulating film.

In a preferred embodiment of the invention the plane that is defined by at least one winding of the measuring coil and the plane of extension of the sensor (of the sensors) are essentially located in the main plane of extension of the semiconductor chip and/or parallel to it. The sensor and/or the measuring coil may then have a correspondingly large surface area, which makes it possible for the measuring device to have high sensitivity.

In another preferred embodiment of the invention the plane that is defined by at least one winding of the measuring coil and the plane of extension of the sensor (of the sensors) are arranged transverse to and, in particular, approximately orthogonal to the main plane of extension of the semiconductor chip. In this case, the sensor and, if applicable, the measuring coil only require a relatively small chip surface area, so that the semiconductor chip can have compact dimensions and can be fabricated in a correspondingly economical manner.

In a further embodiment of the invention the measuring device has, in addition to the at least one first measuring coil and the at least one first sensor for measuring low-frequency magnetic fields, at least one second measuring coil and at least one second sensor for measuring low-frequency magnetic fields, as well as at least one third measuring coil and at least one third sensor for measuring low-frequency magnetic fields, and said measuring coils and sensors are monolithically integrated into the semiconductor chip or are located in the substrate, and the lines normal to the planes of extension of the first measuring coil and of the first sensor are oriented in a first measuring direction, and the lines normal to the planes of extension of the second measuring coil and of the second sensor are oriented in a second measuring direction, and the lines normal to the planes of extension of the third measuring coil and of the third sensor are oriented in a third measuring direction, and the second measuring direction is arranged orthogonal to is the first measuring direction, and the third measuring direction is arranged orthogonal to the first measuring direction and to the second measuring direction, The directions of the x, y, and z axes, respectively, of a Cartesian coordinate system then correspond to the measuring direction, so that the x, y, and z components of the magnetic field may be measured in a simple manner with the aid of the measurement device. This allows the position and magnitude of the magnetic field vector in space to be determined.

It is advantageous if at least one measuring coil has least two trace planes that are located at a distance from each other, if the traces of a first trace plane run transverse and preferably perpendicular to the traces of at least one second trace plane, and if the traces of the first trace plane are connected by means of vias to the traces of the at least one second trace plane. The measuring coil may then have a plurality of windings. It is also possible in some cases that the semiconductor chip has, in addition to the trace plane that has the traces for the measuring coil, at least one additional trace plane in which the traces that are required for the signal processing device and/or at least one additional circuit integrated into the semiconductor chip are located.

In another preferred embodiment of the invention, in at least one trace plane the measuring coil has a trace that has a plurality of windings arranged inside of each other. In this way, the trace may have, for example, a spiral-shaped or polygon-shaped path.

In a preferred embodiment of the invention the measuring direction of the at least one measuring coil and the measuring direction of the at least one sensor are arranged transverse and, in particular, orthogonal to each other. An arrangement of this type is preferably used for applications in which the magnetic field that is to be measured has a number of components $B_x$, $B_y$, $B_z$ that are arranged normal to each other and in which these components are linked together. A measuring device of this type may be used in particular in an automotive vehicle.

It is advantageous if the sensor or its orthogonal projection onto the plane of extension of the measuring coil is located within the measuring coil. The chip surface area that is available on the semiconductor chip can then be utilized especially well.

The measuring device of the invention may be contained in a position, velocity, and/or acceleration sensor that has a sender that has at least one magnetic pole and that is positioned relative to the measuring device in such a way that the magnetic poles can be moved past the measuring device. With the aid of the measuring device, the movement of the sender can be measured with high precision across a wide range of velocity. The magnetic poles may have a least one permanent magnet and/or one pole coil.

In a preferred embodiment of the invention, the sender is positioned so that it can rotate relative to the measuring device. A sender of this type may be provided, for example, to measure the position, angular velocity and/or angular acceleration of a rotating machine part, such as a shaft, a rotating part of an internal combustion engine, or a rotor of an electrical machine.

In another preferred embodiment of the invention, the sender is positioned so that it can move linearly relative to the measuring device, A measuring device of this type may be located in particular on a linear motor of a sliding guide and/or a valve shaft.

Figure 2:
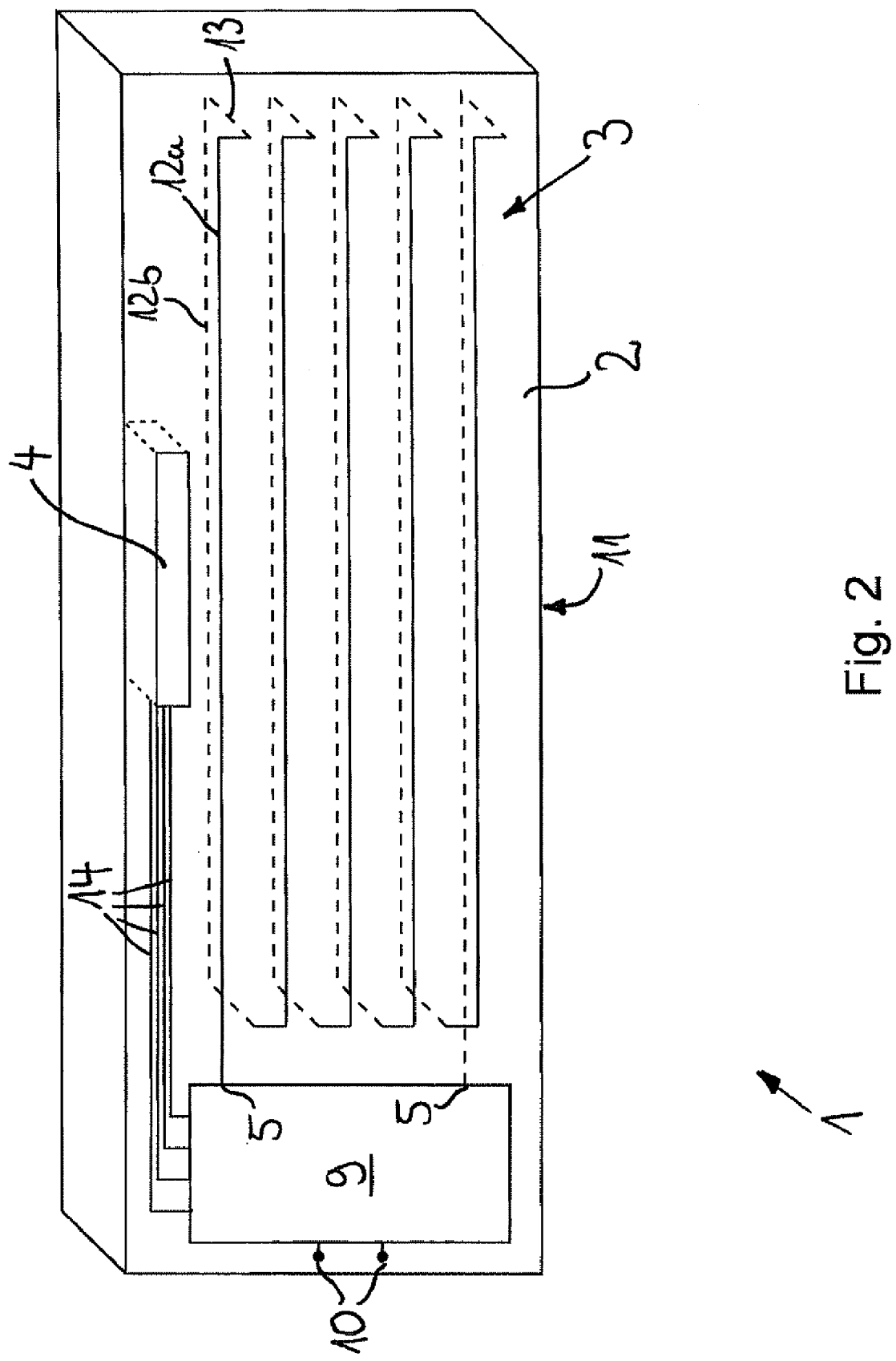
Figure 3:
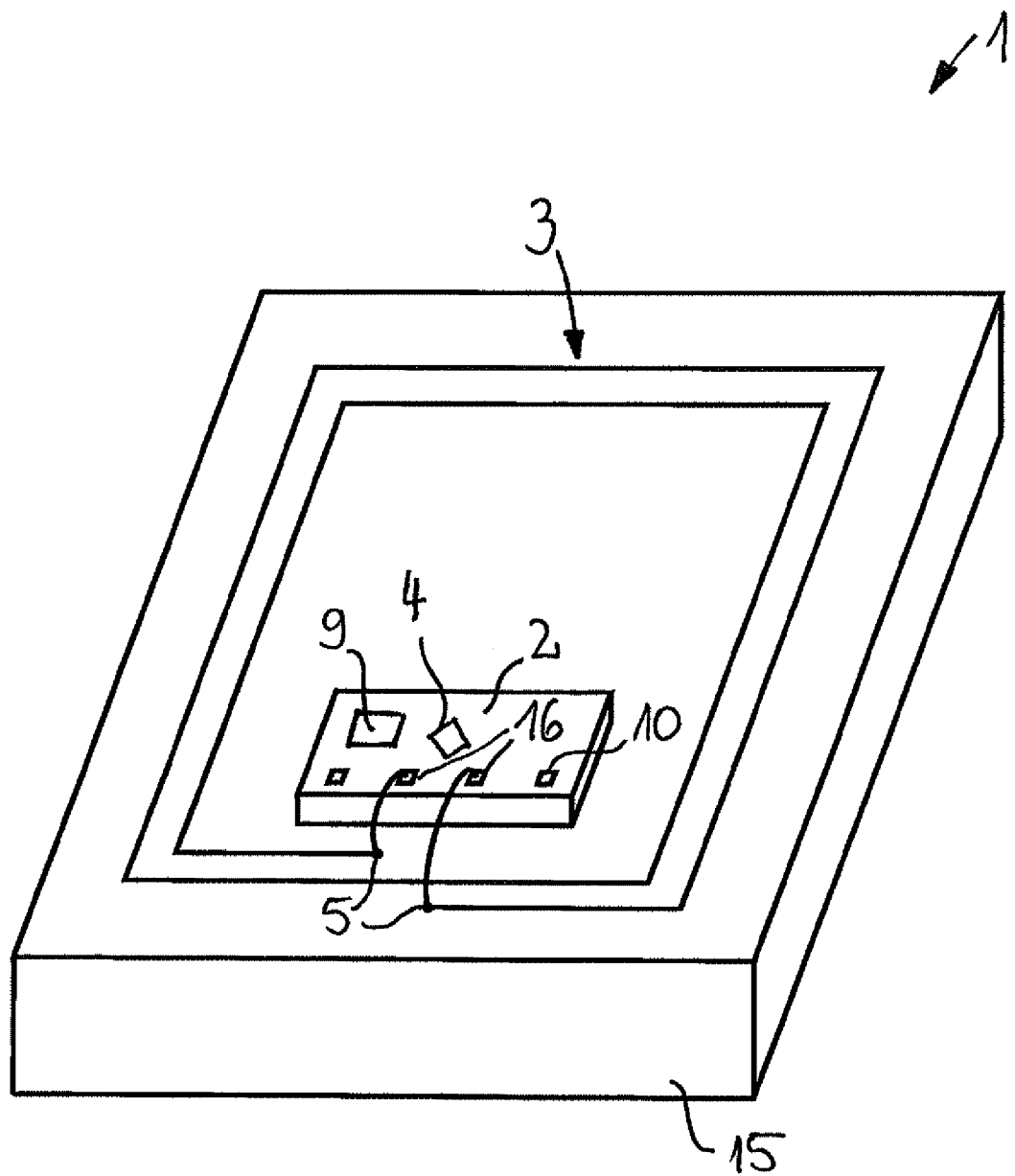
Figure 4:
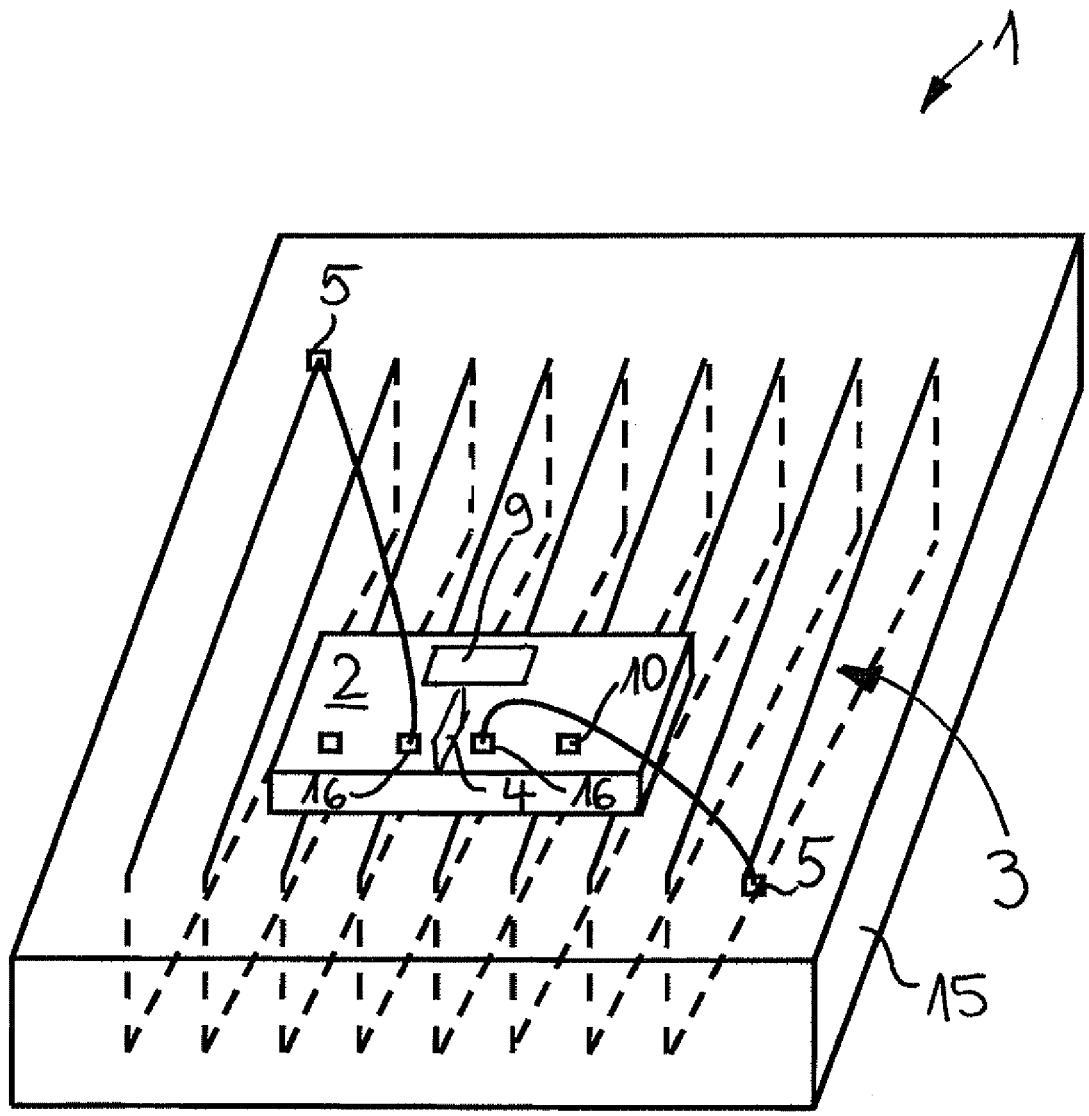
Figure 5:
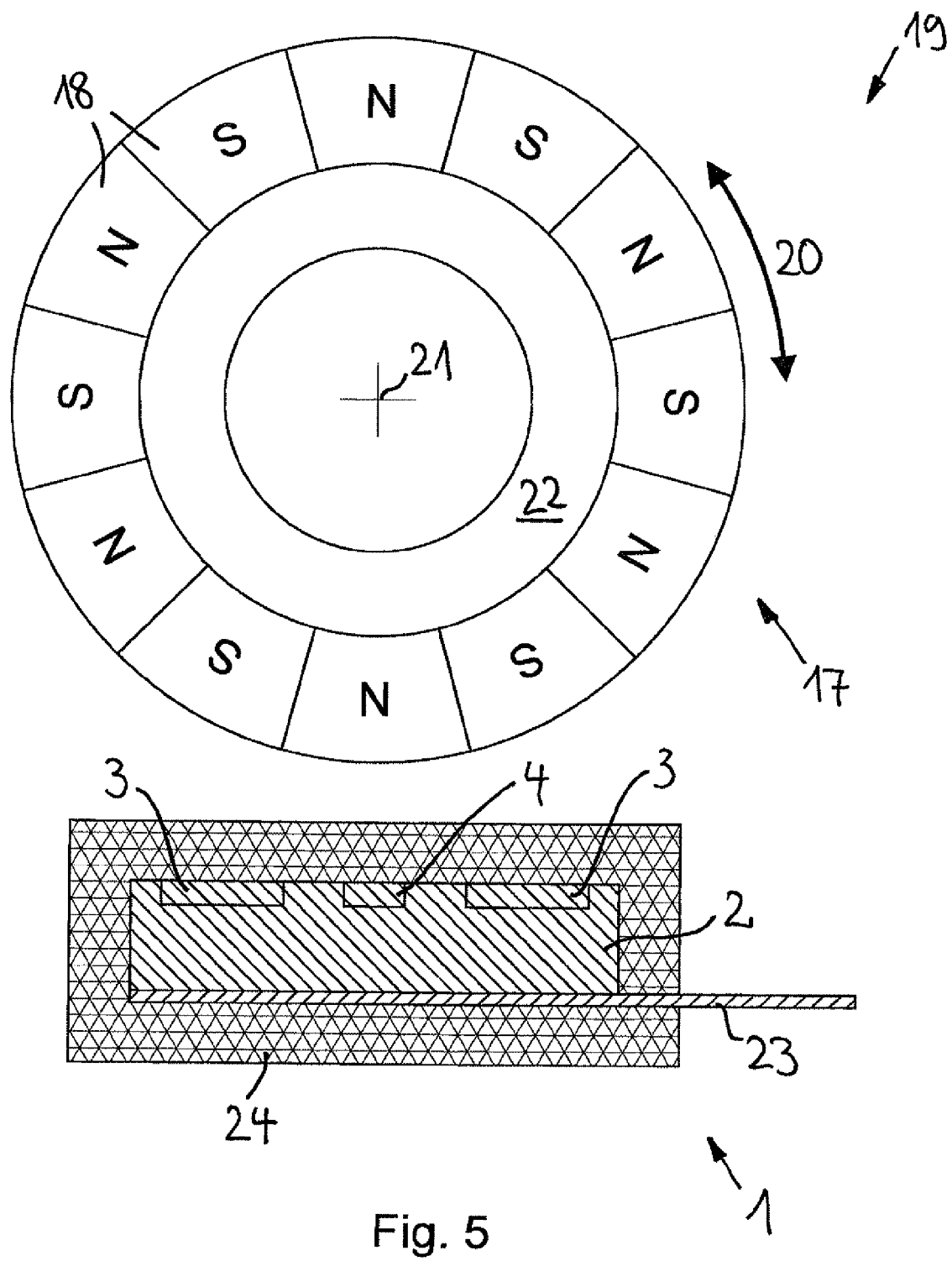
Figure 6:
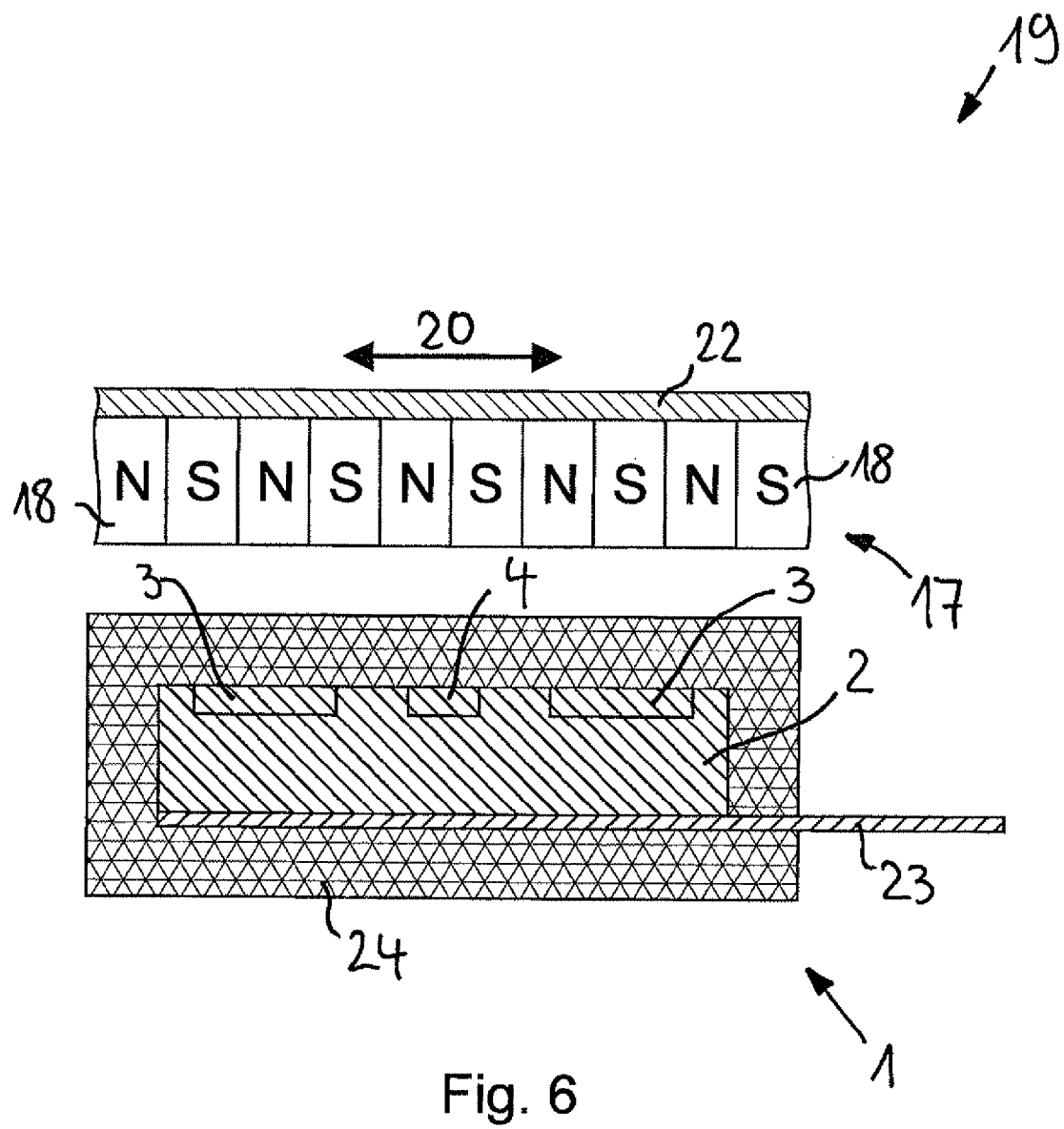
Figure 7:
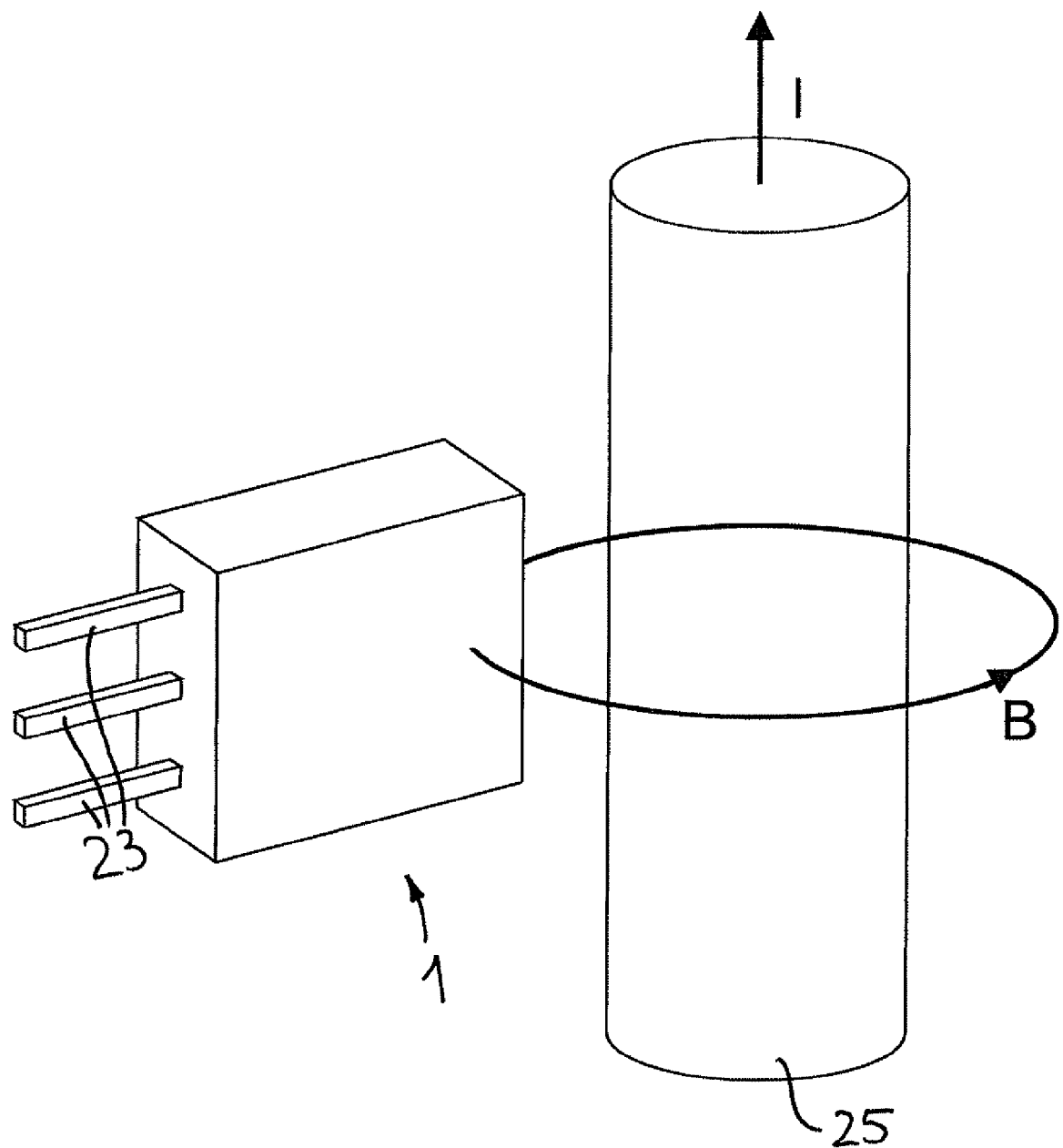
Figure 8:
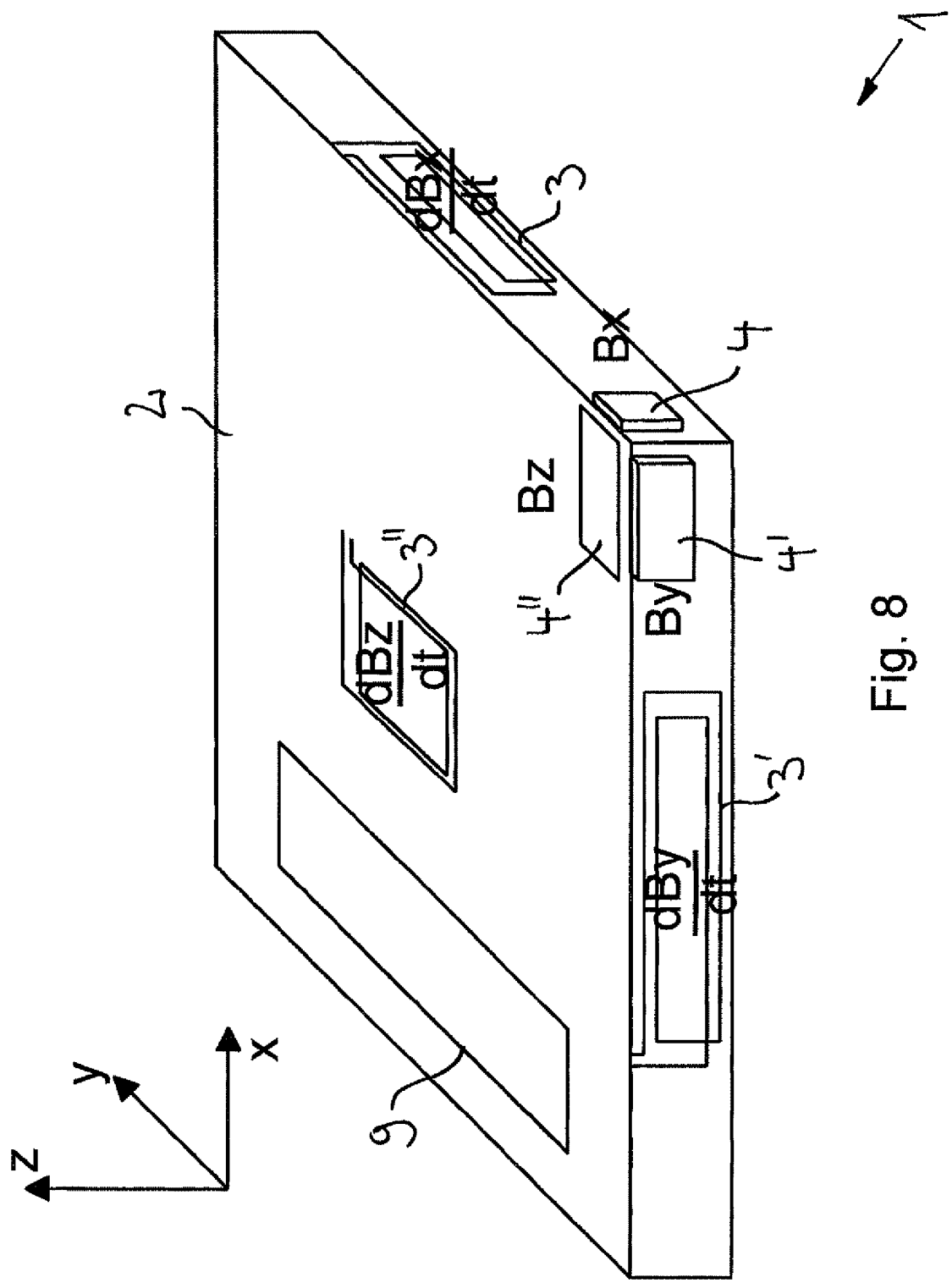

Embodiment examples of the invention are explained in greater detail below with reference to the drawing. The drawing shows:

FIG. 1 A plan view of an embodiment example of a semiconductor chip in which a measuring coil, a Hall-effect sensor, and a signal processing device are monolithically integrated, and the Hall plate of the Hall-effect sensor and the signal processing device are merely represented in schematic form, FIG. 2 A plan view of a second embodiment example of a semiconductor chip into which a so-called vertical Hall plate is integrated, FIG. 3 A measuring device in which the measuring coil and a semiconductor chip that contains the Hall-effect sensor and the signal processing device are located on a printed circuit board, FIG. 4 An additional embodiment example of the measuring device in which the planes defined by the windings of the measuring coil are approximately orthogonal to the plane of extension of the printed circuit board, FIG. 5 A cross-section through a first embodiment example of a position, velocity, and/or acceleration sensor FIG. 6 A cross-section through a second embodiment example of a position, velocity, and/or acceleration sensor, FIG. 7 A measuring device to acquire a measurement signal that corresponds to the electrical current in a conductor, and FIG. 8 A third embodiment example of a semiconductor chip that has three measuring coils and three Hall-effect sensors that are arranged for the vectorial measurement of a magnetic field.

A measuring device, which is identified as a single component in FIG. 1 with the reference number 1, and is used for measuring a magnetic field has a semiconductor chip 2 in which a measuring coil 3 and a Hall-effect sensor 4 are monolithically integrated. The measuring coil 3 and the Hall-effect sensor 4 are each arranged with their planes of extension in the planes defined by the semiconductor chip 2, which corresponds to the drawing plane in FIG. 1. The magnetic flux of the magnetic field that is to be measured runs transverse and preferably perpendicular to this plane.

The measuring coil 3 has on its ends first electrical connections 5, on which a first measurement signal is applied and that corresponds to the electrical voltage that is induced upon a change in the magnetic field in measuring coil 3. The first measurement signal is roughly proportional to the rate of change of the magnetic field in accordance with the law of induction, which is why the relatively high frequency signal components contained in the magnetic field are more numerous in the measurement signal than are the low-frequency signal components. If the components that may be present in the magnetic field are identical, no measurement signal is caused at measuring coil 3.

The Hall-effect sensor 4 has a Hall plate 6 on which the two electrical connections that are distant from each other 7 into which a constant current, which is provided by a measuring current source that is not depicted in greater detail in the drawing, is fed. In addition, third electrical connections 8 for picking up the Hall-effect voltage that is caused by the magnetic field are provided on the Hall plate 6. In the text below, the Hall-effect voltage is also referred to as the second measurement signal. The second measurement signal contains a constant component that is present in the magnetic field as well as a changing component. However, the second measurement signal decreases as the frequency of the magnetic field increases.

The first electrical connections 5 and the third electrical connections 8 are each connected to an input of a signal processing device 9 that is monolithically integrated into the semiconductor chip 2 as an electrical circuit. The signal processing device 9 generates an output signal that corresponds to the magnetic field, that can be scanned at an output 10, and that is a function of the first measurement signal and the second measurement signal. The output signal equally includes the unchanging component of the magnetic field as well as low-frequency and high-frequency components, so that a nearly linear frequency response results across a wide frequency range.

FIG. 1 shows that the measuring coil 3 has a plurality of windings, each of which is comprised of a plurality of straight conductor trace sections. The individual trace sections each extend along a line parallel to the outer contour 11 of the semiconductor chip 2. Beginning from the center of measuring coil 3 and moving to the edge of the semiconductor chip 2, the length of the straight trace sections increases from winding to winding.

The measuring coil 3 has two trace planes that are located parallel to each other at a distance from each other, The traces 12a of a first trace plane appear in the drawing as solid lines and the traces 12*b* of a second trace plane appear as dashed lines. It can be clearly seen that the traces 12*a* of the first trace plane in the plan view onto the semiconductor chip 2 are approximately perpendicular to the traces 12*b* of the second semiconductor plane. The traces 12*a*, 12*b* of the various trace planes are connected to each other by means of via paths.

The Hall-effect sensor 4 or its orthogonal projection onto the plane of extension of the measuring coil 3 is located within measuring coil 3 in the space defined by the innermost winding. The connection traces 14 between the Hall plate 6 and the signal processing device extend between the traces 12*a* in the first trace level.

In the embodiment example shown in FIG. 2 the plane in which the Hall plate 6 extends is arranged orthogonal to the main plane of extension of the semiconductor chip 2. The windings of the measuring coil 3 extend approximately parallel to the plane of the Hall plate 6.

The measuring coil 3 has two trace planes that are located parallel to each other at a distance from each other. The traces 12*a* of a first trace plane are represented in the drawing as solid lines and the traces 12*b* of a second trace plane as well as the vias 13 are represented as dashed lines. The traces 12*a* of the first trace plane run approximately parallel to the traces 12*b* of the second trace plane.

In the embodiment example shown in FIG. 3, the semiconductor chip 2 is located on a printed circuit board that has an essentially two-dimensional substrate 15 on and/or in which an electrical trace that forms the measuring coil 3 is located. The Hall-effect sensor 4 and the signal processing device 9 are monolithically integrated into the semiconductor chip 2. The signal processing device 9 is electrically connected to the ends of the measuring coil 3 by means of terminal contacts 16 provided on the semiconductor chip 2, for example by means of solder junctions. The planes of extension of the semiconductor chip 2 and the Hall plate of the Hall-effect sensor 4 run approximately parallel to the plane of the substrate 15. The windings of the measuring coil 3 essentially run around the semiconductor chip 2. If necessary, the printed circuit board 15 may have a plurality of layers, each with traces that each form a section of the measuring coil 3. This makes it possible to have a relatively number of windings. The individual trace layers can be connected in series by means of vias, and/or they can be connected to the terminal contacts 16.

In the embodiment example shown in FIG. 4 the traces for the measuring coil 3 are arranged on the substrate 15 in such a way that they run from planes defined by the windings of the measuring coil 3 approximately orthogonal to the plane of extension of the is substrate 15. The circuit board has two planes with traces that are transverse to the plane of extension of the substrate 15 at a distance from each other. Each trace plane has a plurality of trace sections that run approximately parallel to each other and that are connected by means of the vias to the corresponding trace sections of an additional trace plane.

The semiconductor chip 2 is located above the measuring coil 3 on the substrate 15. The plane in which the semiconductor chip 2 extends runs approximately parallel to the plane of extension of the substrate 15. As in the embodiment example shown in FIG. 3, the Hall-effect sensor 4 and the signal processing device 9 are monolithically integrated into the semiconductor chip 2. The signal processing device 9 is connected by means of the terminal contacts 16 provided on the semiconductor chip 2 to the ends of the measuring coil 3. The plane in which the Hall plate 6 extends is arranged orthogonal to the plane of extension of the semiconductor chip 2.

The measuring device 1 may be located in a position, velocity, and/or acceleration sensor 19. This sensor has a sender 17 that is mounted in such a way that it can move relative to the measuring device I in a direction shown by the double arrow 20; in the embodiment example shown in FIG. 5 the sender 17 is configured as a sender wheel mounted on an axle 21 so that it can rotate. The sender 17 has a plurality of magnetized permanently magnetic magnetic poles 18 arranged in the circumferential direction one after another on the outer circumference of the sender 17. In this case the north and south poles alternate. The magnetic poles 18 are connected to each other on the inner circumference of the sender by means of a magnetically conducting yoke 22.

The magnetic poles 18 are able to move past the measuring device 1 thereby causing an alternating magnetic flux that passes through the measuring coil 3 and the Hall plate 6, in each case approximately orthogonal to their planes of extension. In the output signal of the signal processing device 9 each time a magnetic pole 18 passes by the measuring device 1 a pulse or a pulse gap is generated, even if the magnetic poles 18 pass by the measuring device 1 at a very low speed or a very high speed.

In FIG. 5 it can still be seen that the semiconductor chip 2 is located on a frame 23 and is molded together with a solidified casting compound 24, such as an electrically insulating plastic.

In the position, velocity, and/or acceleration sensor 19 shown in FIG. 6 the sender 17 can be moved relative to the measuring device 1 parallel to the plane of the semiconductor chip 2. The magnetic poles 18 are arranged next to each other on a soft magnetic yoke 22 in a row extending in the direction of movement.

In the embodiment example shown in FIG. 7 the measuring device 1 is arranged adjacent to an electrical current-carrying conductor 25 in such a way that the magnetic flux B that is induced by the electrical current I passes through the measuring coil 3 and the Hall plate 5, in each case approximately orthogonal to their planes of extension. The signal processing device 9 is designed in such a way that its output signal models the electrical current that flows through conductor 25. The measuring device 1 can be positioned by means of a mounting, which is not shown in the drawing, in a predetermined position relative to the conductor 25.

In an additional embodiment example shown in FIG. 8, in addition to a first measuring coil 3 and a first Hall-effect sensor 4, a second measuring coil 31 and a second Hall-effect sensor 4', as well as a third measuring coil 3" and a third Hall-effect sensor 4", are integrated into the semiconductor chip 2. The first and second Hall-effect sensors 4, 4' are designed as vertical Hall-effect sensors, and the third Hall-effect sensor 4' is designed as a horizontal Hall-effect sensor. In a corresponding manner, the first and second measuring coils 3, 3' are arranged with their planes of extension normal to the chip plane of the semiconductor chip 2, while the third measuring coil 3" is arranged with its plane of extension parallel to the plane of the semiconductor chip 2.

The lines normal to the planes of extension of the first measuring coil 3 and of the first sensor 4 are oriented in a first measuring direction, which points in the direction of an x axis, The lines normal to the planes of extension of the second measuring coil 3' and of the second sensor 4' are oriented in a second measuring direction, which points in the direction of a y axis. The lines normal to the planes of extension of the third measuring coil 3" and the third sensor 4" are oriented in a third measuring direction, which points in the direction of a z axis. The x, y, and z axes are arranged orthogonal to each other and form a Cartesian coordinate system.

The first electrical connections 5 of the measuring coils 3; 3', 3" and the second electrical connections 5 of the sensors 4, 4', 4" are connected by means of traces, which are not shown in the drawing, to the associated inputs of the signal processing device 9 that is integrated into the semiconductor chip 2.

The invention claimed is:

1. A measuring device to measure a magnetic field, the device comprising:
   at least one measuring coil; and
   at least one sensor configured to measure low-frequency magnetic fields, the measuring coil and the sensor are configured such that their planes of extension are each positioned or positionable transverse to a flux direction of the magnetic field, and the measuring coil and the sensor are connected to a signal processing device with which, depending on a first measurement signal provided by the measuring coil and a second measurement signal provided by the sensor, an output signal that essentially corresponds to the magnetic field can be generated,
   wherein the measuring coil, the sensor, and the signal processing device are monolithically integrated into a semiconductor chip.

2. The measuring device of claim 1, wherein windings of the measuring coil essentially follow an outer contour of the semiconductor chip and/or a line that is located at a distance from it and is approximately parallel to it.

3. The measuring device of claim 1, wherein the plane defined by at least one winding of the measuring coil and the plane of extension of the sensor are essentially located on the main plane of extension of the semiconductor chip and/or parallel to it.

4. The measuring device of claim 1, wherein the plane defined by at least one winding of the measuring coil and the plane of extension of the sensor are located transverse and, in particular, approximately orthogonal to the main plane of extension of the semiconductor chip.

5. The measuring device of claim 1, wherein said measuring device further comprises:
   at least one second measuring coil;
   at least one second sensor for measuring low-frequency magnetic fields;
   at least one third measuring coil; and
   at least one third sensor for measuring low-frequency magnetic fields; and
   wherein said first and second measuring coils and said first, second and third sensors are monolithically integrated into the semiconductor chip or are located in the substrate,
   wherein lines normal to the planes of extension of the first measuring coil and of the first sensor are oriented in a first measuring direction,
   wherein lines normal to the planes of extension of the second measuring coil and of the second sensor are oriented in a second measuring direction,
   wherein lines normal to the planes of extension of the third measuring coil and of the third sensor are oriented in a third measuring direction, and
   wherein a second measuring direction is arranged orthogonal to a first measuring direction, and a third measuring direction is arranged orthogonal to the first measuring direction and to the second measuring direction.

6. The measuring device of claim 1, wherein the measuring coil has at least two traces that are located at a distance from each other, wherein the traces of a first trace plane run transverse and perpendicular to the traces of at least one second trace plane, and wherein the traces of the first trace plane are connectable by vias with the traces of at least one second trace plane.

7. The measuring device of claim 1, wherein the measuring coil has one trace that has a plurality of windings arranged inside of each other in at least one trace plane.

8. The measuring device of claim 1, wherein the measuring direction of the at least one measuring coil and the measuring direction of the at least one sensor are disposed transverse and orthogonal to each other.

9. The measuring device of claim 1, wherein the sensor or its orthogonal projection onto the plane of extension of the measuring coil is located within the measurement coil.

10. The position, velocity, and/or acceleration sensor of claim 9, wherein the sender is held in such a way that it can rotate relative to the measuring device.

11. A position, velocity, and/or acceleration sensor having at least one measuring device according to claim 1 and having at least one sender that has a magnetic pole and that is positioned relative to the measuring device such that the magnetic poles are configured to be movable past the measuring device.

12. The position, velocity, and/or acceleration sensor of claim 11, wherein the sender is held in such a way that it can move linearly relative to the measuring device.

13. A measuring device configured to measure a magnetic field, the device comprising:
   at least one measuring coil; and
   at least one sensor to measure low-frequency magnetic fields, the measuring coil and the sensor are configured such that their planes of extension each positioned or positionable transverse to a flux direction of the magnetic field, and the measuring coil and the sensor are connected to a signal processing device with which, depending on a first measurement signal provided by the measuring coil and a second measurement signal provided by the sensor, an output signal that essentially corresponds to the magnetic field is generatable,
   wherein a semiconductor chip that has the at least one sensor is located on an essentially two-dimensional substrate,
   wherein the measuring coil is formed by at least one trace that is located on and/or in the substrate, and
   wherein the sensor and the signal processing device are monolithically integrated into the semiconductor chip.

14. The measuring device of claim 13, wherein the plane defined by at least one winding of the measuring coil and the plane of extension of the sensor are essentially located on the main plane of extension of the semiconductor chip and/or parallel to it.

* * * * *